(12) United States Patent
Asakawa et al.

(10) Patent No.: US 11,424,128 B2
(45) Date of Patent: Aug. 23, 2022

(54) APPARATUS AND METHOD FOR ETCHING SUBSTRATE

(71) Applicant: TOKYO ELECTRON LIMITED, Tokyo (JP)

(72) Inventors: Yuji Asakawa, Nirasaki (JP); Nobuhiro Takahashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 177 days.

(21) Appl. No.: 16/821,440

(22) Filed: Mar. 17, 2020

(65) Prior Publication Data

US 2020/0312668 A1  Oct. 1, 2020

(30) Foreign Application Priority Data

Mar. 26, 2019  (JP) .............................. JP2019-058218

(51) Int. Cl.
*C23C 16/44* (2006.01)
*H01L 21/3065* (2006.01)
(Continued)

(52) U.S. Cl.
CPC .......... *H01L 21/3065* (2013.01); *C23C 16/22* (2013.01); *C23C 16/4412* (2013.01); *C23C 16/4582* (2013.01); *H01L 21/31116* (2013.01); *H01L 21/67017* (2013.01); *H01L 21/6719* (2013.01); *H01L 21/67276* (2013.01)

(58) Field of Classification Search
CPC . C23C 16/22; C23C 16/4412; C23C 16/4582; C23C 16/45565; H01L 21/3065; H01L 21/31116; H01L 21/67017; H01L 21/6719; H01L 21/67276; H01L 21/68771; H01L 21/67069; H01L 21/32135
USPC .............. 156/345.29, 345.3, 345.33, 345.34; 438/706, 714
See application file for complete search history.

(56) References Cited

U.S. PATENT DOCUMENTS 5,846,883 A * 12/1998 Moslehi ................ H01J 37/321
 438/711
6,238,588 B1 * 5/2001 Collins ............. H01J 37/32165
 216/68

(Continued)

FOREIGN PATENT DOCUMENTS

JP  2012-146854 A  8/2012
KR  10-2016-0009542 A  1/2016
(Continued)

*Primary Examiner* — Lan Vinh
(74) *Attorney, Agent, or Firm* — Nath, Goldberg & Meyer; Jerald L. Meyer; Tanya E. Harkins

(57) ABSTRACT

A substrate etching apparatus for etching a substrate, the substrate etching apparatus includes a treatment container configured to accommodate a substrate, a stage on which the substrate is placed, the stage being disposed in the treatment container, a gas supply configured to supply a treatment gas from an upper space above the stage toward the stage, and a gas exhauster configured to evacuate an interior of the treatment container. The gas supply includes a central region facing a central part of the stage and an outer peripheral region having a same central axis as the central region and configured to surround the central region. The gas supply is capable of supplying the treatment gas to each of the central region and the outer peripheral region.

15 Claims, 15 Drawing Sheets

(51) Int. Cl.
*H01L 21/67* (2006.01)
*C23C 16/22* (2006.01)
*C23C 16/458* (2006.01)
*H01L 21/311* (2006.01)

(56) References Cited

U.S. PATENT DOCUMENTS

| | | | | |
|---|---|---|---|---|
| 7,510,976 B2* | 3/2009 | Sung | ................... | H01L 21/0332 |
| | | | | 216/41 |
| 2015/0348755 A1* | 12/2015 | Han | .................... | H01J 37/3244 |
| | | | | 118/723 IR |
| 2016/0322200 A1* | 11/2016 | Alayavalli | ........ | H01J 37/32091 |

FOREIGN PATENT DOCUMENTS

KR    10-2016-0079688 A    7/2016
KR    10-2018-0066844 A    6/2018

\* cited by examiner

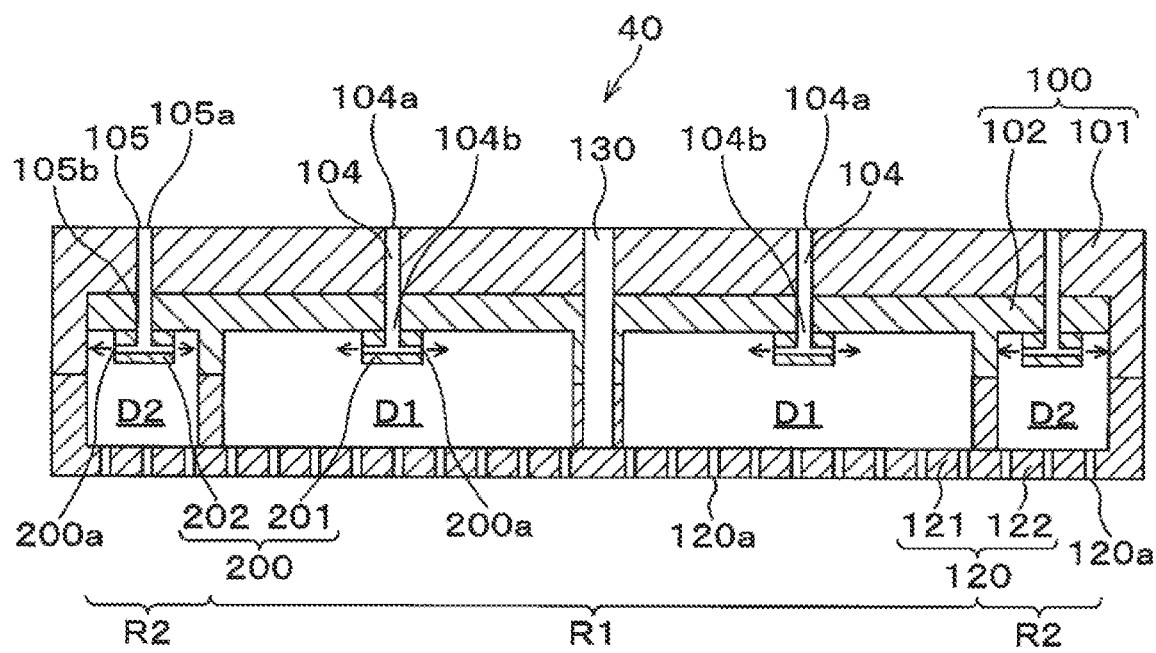

APPARATUS AND METHOD FOR ETCHING SUBSTRATE

CROSS-REFERENCE TO RELATED APPLICATION

This application is based upon and claims the benefit of priority from Japanese Patent Application No. 2019-058218, filed on Mar. 26, 2019, the entire contents of which are incorporated herein by reference.

TECHNICAL FIELD

The present disclosure relates to an apparatus and a method for etching a substrate.

BACKGROUND

Patent document 1 discloses a treatment apparatus which treats a plurality of wafers, for example, two wafers at the same time. In the treatment apparatus, in order to suppress the flow of a treatment gas from becoming uneven on the surfaces of the two wafers, a baffle plate which vertically partitions the interior of the treatment container into a treatment space and an exhaust space is provided.

PRIOR TECHNICAL DOCUMENTS

Patent Documents

Japanese Patent Application Publication No. 2012-146854

SUMMARY

According to embodiments of the present disclosure, there is provided a substrate etching apparatus for etching a substrate, the substrate etching apparatus includes a treatment container configured to accommodate a substrate, a stage on which the substrate is placed, the stage being disposed in the treatment container, a gas supply configured to supply a treatment gas from an upper space above the stage toward the stage, and a gas exhauster configured to evacuate an interior of the treatment container. The gas supply includes a central region facing a central part of the stage and an outer peripheral region having a same central axis as the central region and configured to surround the central region. The gas supply is capable of supplying the treatment gas to each of the central region and the outer peripheral region.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 15 is a longitudinal sectional view schematically illustrating a configuration of a shower head according to another embodiment.

DETAILED DESCRIPTION

Figure 1:
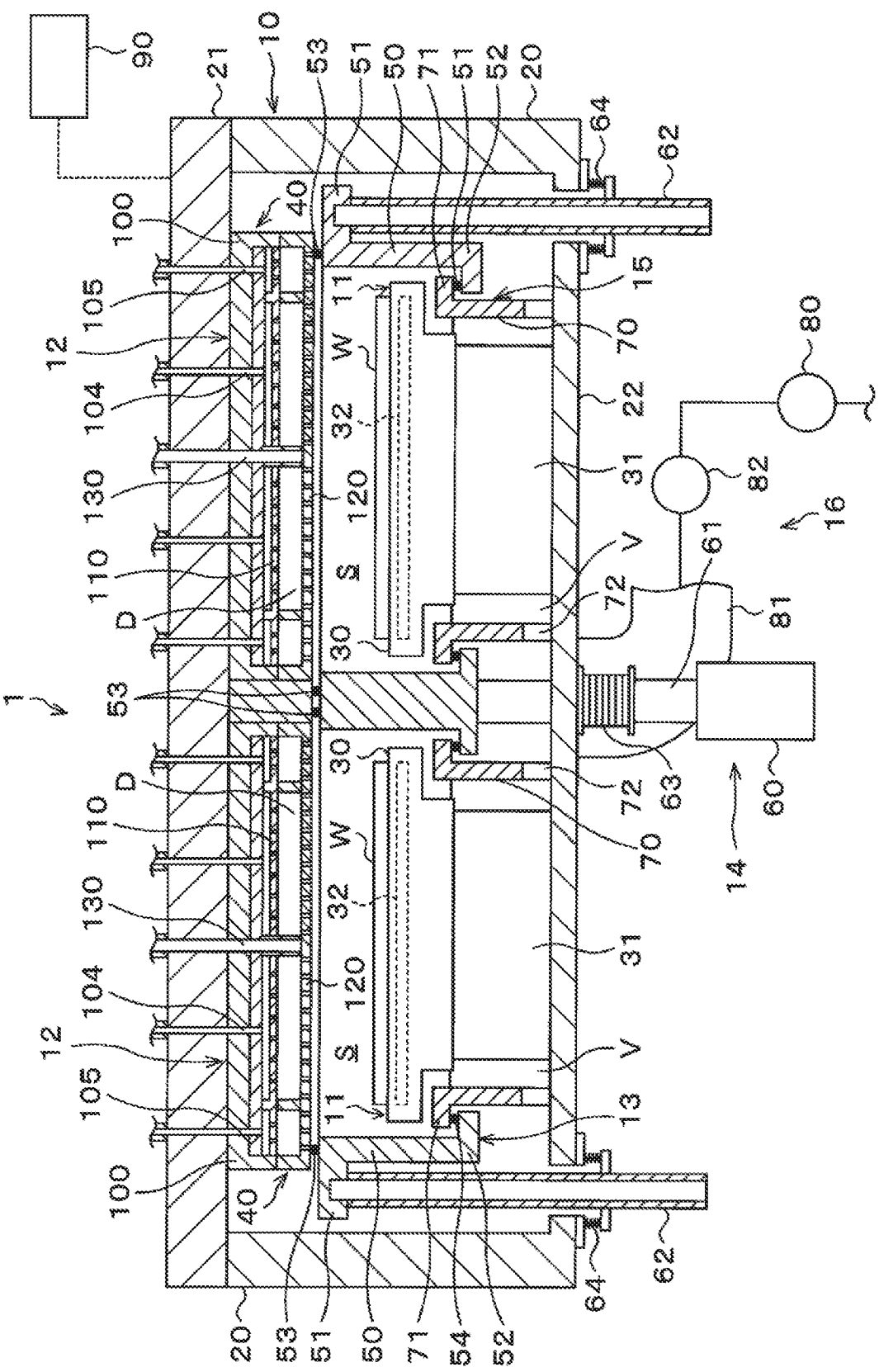
FIG. 1 is a longitudinal sectional view schematically illustrating a configuration (a configuration at a wafer treatment position) of an etching apparatus according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a semiconductor device, a film that contains silicon is used in a wide variety of applications. For example, a silicon germanium (SiGe) film or a silicon (Si) film is used for a gate electrode or a seed layer. Further, in a process of manufacturing a semiconductor device, after a SiGe film or a Si film is formed on a substrate, it is etched to have a predetermined pattern.

A silicon-containing film such as a SiGe film or a Si film is etched through various conventional methods. Specifically, in recent years, accompanying the increased miniaturization of semiconductor devices, a finer etching method called a chemical oxide removal (COR) process has been used instead of a conventional etching technology such as plasma etching or wet etching.

The COR process is a process of producing a product by supplying a treatment gas to, for example, a semiconductor wafer (hereafter, referred to as a 'wafer') as a workpiece and causing the treatment gas to react with, for example, a film formed on the wafer in a treatment container that is maintained in a vacuum state. The product produced on a surface of the wafer through the COR process is sublimated through a heating process, which is the next process, and accordingly, the film on the surface of the wafer is removed.

The COR process is performed by a batch type treatment apparatus which treats the wafers one by one, but in order to improve through-put, for example, similar to the treatment apparatus disclosed in patent document 1, a treatment apparatus which treats a plurality of wafers at the same time may be used.

However, because requirements for the uniformity have become stricter in an etching process, it is difficult to secure uniformity in the treatment apparatus disclosed in patent document 1. That is, with a configuration of exhausting the atmosphere in a treatment space from the lower side of a baffle plate that merely partitions the interior of the treatment container vertically into a treatment space and an exhaust space, it is difficult to suitably control the flows, that is, the uniformity and the flow rate of the treatment gas. Accordingly, there is room for improvement in the conventional etching process.

According to the technology of the present disclosure, a silicon-containing film is uniformly etched. Hereinafter, an etching apparatus and an etching method according to the embodiments will be described with reference to the drawings. Further, in the specification and the drawings, the elements having substantially the same functional configurations are given with the same reference numerals and a description thereof will not be repeated.

Etching Apparatus

First, a configuration of an etching apparatus according to an embodiment will be described. FIG. 1 is a longitudinal sectional view schematically illustrating a configuration of an etching apparatus 1 according to an embodiment. Further, in the present embodiment, a case where the etching apparatus 1 is a COR treatment apparatus which performs a COR process on, for example, a wafer W as a substrate will be described. Further, the etching apparatus 1 etches a silicon germanium (SiGe) film as a silicon-containing film formed on the wafer W.

As illustrated in FIG. 1, the etching apparatus 1 includes a treatment container 10 which is configured to be airtight, a plurality of stages 11 (two stages in the present embodiment) in the treatment container 10, on which wafers W are placed, a gas supply 12 which supplies a treatment gas from the upper side of the stages 11 toward the stages 11, a partition wall 13 that surrounds the outsides of the stages 11 and is configured to be elevated, an elevator 14 which is fixed to a bottom surface of the treatment container 10 and elevates the partition wall 13, an inner wall 15 that individually surrounds the outsides of the stages 11, and a gas exhauster 16 that exhausts the interior of the treatment container 10.

The treatment container 10, for example, is a substantially rectangular parallelepiped container as a whole, and is formed of a metal, for example, aluminum or stainless steel. The treatment container 10 has, for example, a substantially rectangular shape in a plan view, and has a cylindrical side wall 20 having an opened upper end and an opened lower end, a ceiling plate 21 that covers the upper surface of the side wall 20 airtightly, and a bottom plate 22 that covers the lower surface of the side wall 20. Further, a seal member (not illustrated) that maintains the interior of the treatment container 10 in a sealed state is provided between an upper end surface of the side wall 20 and the ceiling plate 21. Further, the treatment container 10 is provided with a heater (not illustrated). Further, the bottom plate 22 may be provided with an insulation material.

Each of the stages 11 has a substantially cylindrical shape, and has an upper member 30 including a placing surface for placing the wafer W thereon, and a lower member 31 fixed to the bottom plate 22 to support the upper member 30. A temperature controller 32 that controls the temperature of the wafer W is embedded in each of the upper members 30. The temperature controller 32 controls the temperature of the wafer W on the stage 11 to a predetermined temperature of, e.g., −20 degrees C. to 140 degrees C., for example, by circulating a refrigerant such as water and thus controlling the temperature of the stage 11.

A support pin unit (not illustrated) is provided at a position below the stage 11 on the bottom plate 22, and a wafer W is configured to be delivered between a support pin (not illustrated) driven vertically by the support pin unit and a transfer mechanism (not illustrated) provided outside the etching apparatus 1.

The gas supply 12 has a shower head 40 that supplies the treatment gas to the wafer W placed on the stage 11, and a gas box 41 that supplies the treatment gas to the shower head 40. Further, a detailed configuration of the gas supply 12 will be described below.

The partition wall 13 has two cylindrical parts 50 which individually surround the two stages 11, upper flange parts 51 provided at upper ends of the cylindrical parts 50, and lower flange parts 52 provided at lower ends of the cylindrical parts 50. The inner diameter of each of the cylindrical parts 50 is set to be larger than the outer surface of the stage 11, and thus a gap is formed between the cylindrical part 50 and the stage 11.

Further, the partition wall 13 is provided with a heater (not illustrated), and is heated, for example, to 100 degrees C. to 150 degrees C. By heating, the foreign substances included in the treatment gas are prevented from being attached to the partition wall 13.

A sealing member 53, for example, an O-ring that airtightly blocks the space between the upper flange part 51 and the shower head 40 when the upper flange part 51 and the shower head 40 contact each other as the partition wall 13 is lifted by the elevator 14 is provided on an upper surface of the upper flange part 51, corresponding to each of the stages 11. Further, a seal member 54, for example, an O-ring that airtightly blocks the space between a protrusion 71 of the inner wall 15, which will be described below, and the lower flange part 52 when the protrusion 71 and the lower flange part 52 contact each other is also provided in the protrusion 71, corresponding to each of the stages 11. A treatment space S surrounded by the stage 11, the partition wall 13, and the shower head 40 is defined by lifting the partition wall 13 to bring the shower head 40 and the sealing member 53 into contact with each other to bring the lower flange part 52 and the sealing member 54 into contact with each other.

Figure 2:
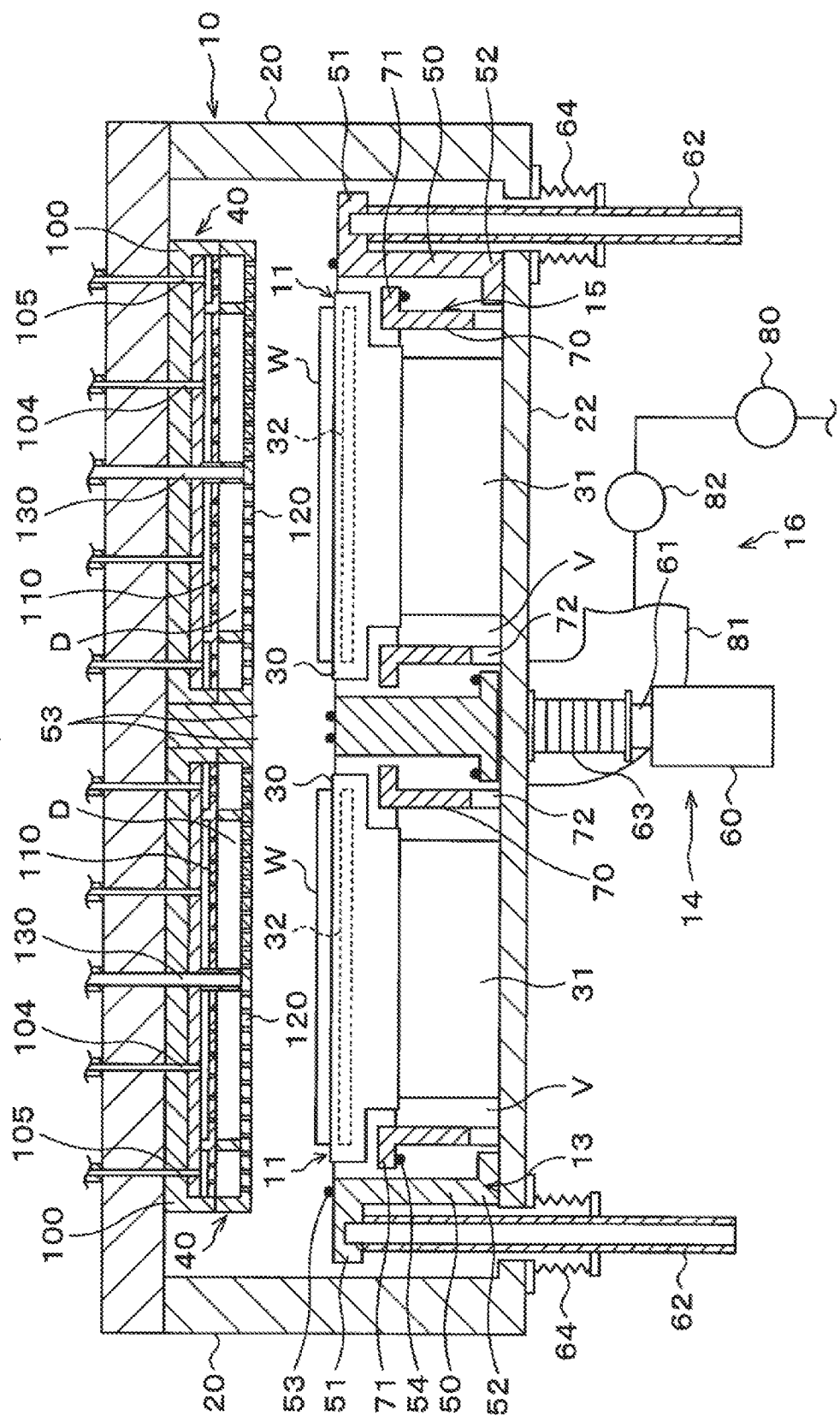
FIG. 2 is a longitudinal sectional view schematically illustrating a configuration (a configuration at an retreated position) of an etching apparatus according to an embodiment.

As illustrated in FIG. 2, the height of the partition wall 13 is set such that the upper surface of the upper flange part 51 is located, for example, lower than the upper surface of the stage 11 when the partition wall 13 is lowered by the elevator 14. Accordingly, the wafer W can be accessed from the outside of the treatment container 10 as the partition wall 13 is lowered. Further, a position (at which the treatment space S is formed) at which the upper flange part 51 of the partition wall 13 contacts the shower head 40 is referred to as "a wafer treatment position", and a position at which the partition wall 13 is lowered down to a position at which the partition wall 13 contacts the bottom plate 22 or a position in the vicinity of the bottom plate 22 is referred to as "an retreated position." Further, FIG. 1 illustrates that the partition wall 13 is at the wafer treatment position, and FIG. 2 illustrates that the partition wall 13 is at the retreated position.

As illustrated in FIG. 1, the elevator 14 that elevates the partition wall 13 has an actuator 60 disposed outside the treatment container 10, a driving shaft 61 connected to the actuator 60 and extending vertically upwards in the treatment container 10 through the bottom plate 22 of the treatment container 10, and a plurality of guide shafts 62, tip ends of which are connected to the partition wall 13 and opposite ends of which extend to the outside of the treatment container 10. The guide shafts 62 prevent the partition wall 13 from being inclined or the like when the partition wall 13 is elevated by the driving shaft 61.

A lower end of the bellows 63, which may be expanded and contracted is connected to the driving shaft 61 airtightly. An upper end of the bellows 63 is connected to the lower surface of the bottom plate 22 airtightly. Accordingly, because the bellows 63 is expanded and contracted along a vertical direction when the driving shaft 61 is elevated, the interior of the treatment container 10 is maintained airtightly. Further, for example, a sleeve (not illustrated) fixed to the bottom plate 22, which functions as a guide during the elevation operation is provided between the driving shaft 61 and the bellows 63.

A bellows 64 which may be expanded and contracted is connected to the guide shaft 62, like the driving shaft 61. Further, an upper end of the bellows 64 is airtightly connected to both the bottom plate 22 and the side wall 20. Accordingly, because the bellows 64 is expanded and contracted along a vertical direction when the driving shaft 61 is elevated, according to the operation of elevating the partition wall 13 by the driving shaft 61, the interior of the treatment container 10 is maintained airtightly. Further, as in the case of the driving shaft 61, between the guide shaft 62 and the bellows 64, a sleeve (not illustrated) that functions as a guide during the elevation operation is provided.

Further, because an upper end of the bellows 64 is a fixed end and a lower end of the bellows 64 connected to the guide shaft 62 is a free end, a force which allows the bellows 64 to be contracted vertically due to a pressure difference between the inside and the outside of the bellows 64 is applied when the internal pressure of the treatment container 10 becomes a negative pressure. Accordingly, the guide shaft 62 connected to the free end of the bellows 64 is lifted vertically as the bellows 64 is contracted. Accordingly, because the seal member 53 and the shower head 40 are brought into contact with each other appropriately by uniformly lifting the partition wall 13, a sealing property between the partition wall 13 and the shower head 40 can be secured. Similarly, because the seal member 54 and the protrusion 71 are brought into contact with each other appropriately, a sealing property between the partition wall 13 and the protrusion 71 can be secured. Further, a reaction force from the bellows 64 as an elastic member or a force that pushes the guide shaft 62 downwards with the weight of the guide shaft 62 is applied to the guide shaft 62, but a differential pressure applied to the guide shaft 62 is adjusted by suitably setting the diameter of the bellows 64.

The inner wall 15 is formed of, e.g., a metal such as aluminum. Further, the inner wall 15 has a substantially cylindrical body 70, and a protrusion 71 that is provided at an upper end of the body 70 and protrudes horizontally toward the outer peripheral direction of the inner wall 15. The inner wall 15 is disposed to individually surround the lower member 31 of the stage 11. Because the inner diameter of the body 70 of the inner wall 15 is set to be larger than the outer diameter of the lower member 31, an exhaust space V is formed between the inner wall 15 and the lower member 31. Further, in the present embodiment, the exhaust space V also includes a space between the partition wall 13 and the upper member 30. Further, as illustrated in FIG. 1, the height of the inner wall 15 is set such that the seal member 54 and the protrusion 71 of the inner wall 15 contact each other when the partition wall 13 is lifted up to the wafer treatment position by the elevator 14. Accordingly, the inner wall 15 and the partition wall 13 contact each other airtightly.

A plurality of slits 72 are formed at a lower end of the inner wall 15. The slit 72 is a gas exhausting hole, through which the treatment gas is discharged. In the present embodiment, the slits 72 are formed substantially at the equal interval along the circumferential direction of the inner wall 15.

Further, the inner wall 15 is fixed to the bottom plate 22. Further, as described above, because the treatment container 10 is configured to be heated by a heater (not illustrated), the inner wall 15 is also heated by the heater of the treatment container 10. The inner wall 15 is heated, for example, to 100 degrees C. to 150 degrees C., and the foreign substances contained in the treatment gas are prevented from being attached to the inner wall 15.

The gas exhauster 16 has a gas exhaust mechanism 80 that exhausts the interior of the treatment container 10. The gas exhaust mechanism 80 is located in the bottom plate 22 of the treatment container 10, and is connected to a gas exhaust pipe 81 provided on the outside of the inner wall 15. The gas exhaust mechanism 80 and the gas exhaust pipe 81 are provided in common in two inner walls 15. That is, the treatment gas from the two exhaust spaces V is discharged by the gas exhaust mechanism 80 through the common gas exhaust pipe 81. The gas exhaust pipe 81 is provided with a control valve 82 that controls the amount of the gas exhausted by the gas exhaust mechanism 80. Further, the ceiling plate 21 is provided with a pressure measuring mechanism (not illustrated) for measuring the pressures of the treatment spaces S of the stages 11. The opening degree of the control valve 82 is controlled, for example, on the basis of the value measured by the pressure measuring mechanism.

The etching apparatus 1 is provided with a control device 90 as a controller. The control device 90 is, for example, a computer, and has a program storage part (not illustrated). A program that controls the treatment of the wafer W in the etching apparatus 1 is stored in the program storage part. Further, a program for executing an etching process in the etching apparatus 1, which will be described below, by controlling an operation of a driving system such as the various treatment devices or the transfer device which have been described above, is also stored in the program storage part. Further, the program is recorded in a computer readable recording medium, and may be installed in the control device 90 from the recording medium.

Gas Supply

Figure 3:
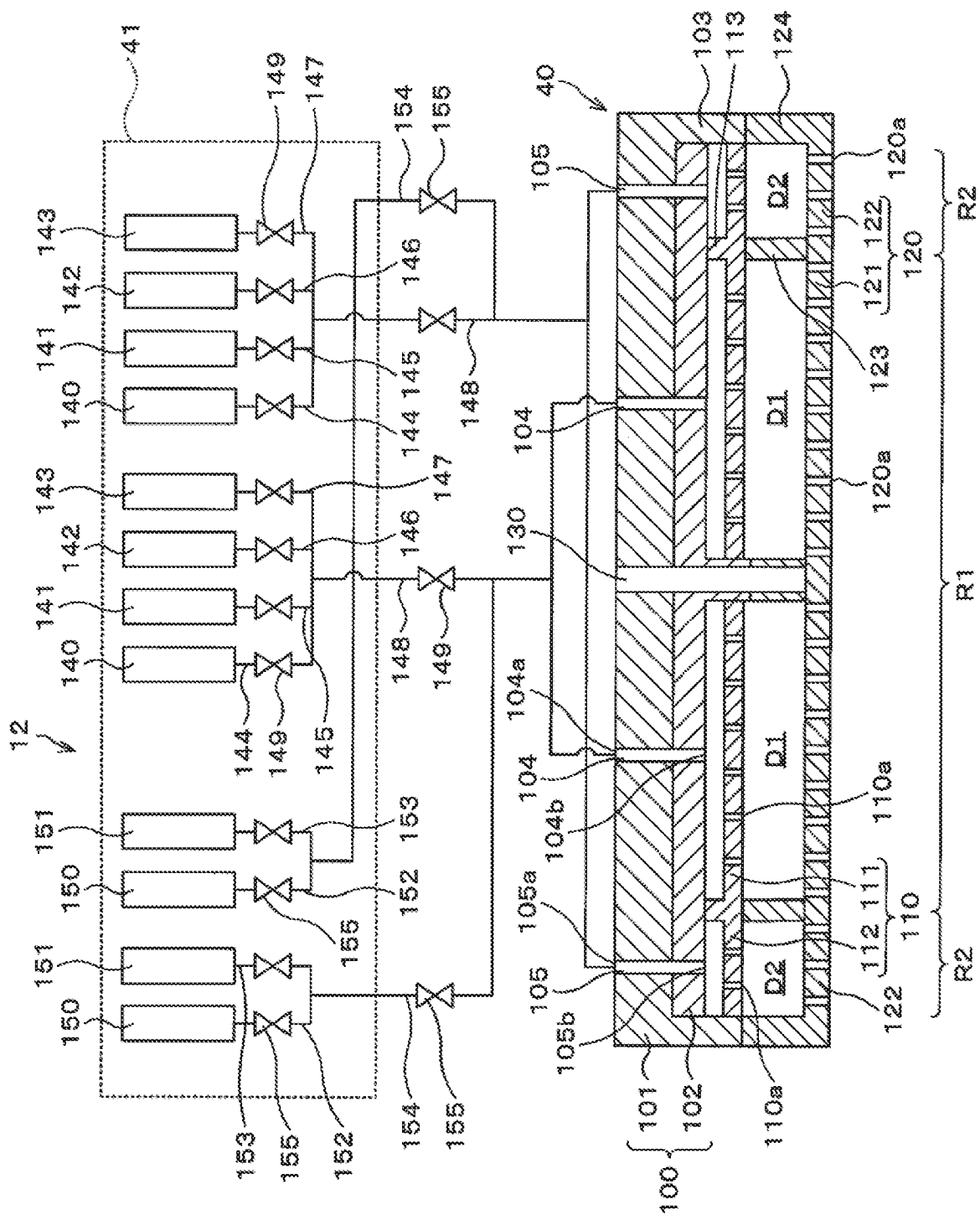
FIG. 3 is a diagram schematically illustrating a configuration of a gas supply.

Next, a configuration of the gas supply 12 will be described below. FIG. 3 is a diagram schematically illustrating a configuration of a gas supply 12. As illustrated in FIG. 3, the gas supply 12 has a shower head 40 and a gas box 41. The shower heads 40 are individually provided to face the stages 11, respectively, on a lower surface of the ceiling plate 21 of the treatment container 10. In the present embodiment, two shower heads 40 are integrally provided. Further, FIG. 3 illustrates only one shower head 40, among the two shower heads 40.

Shower Head

Figure 4:
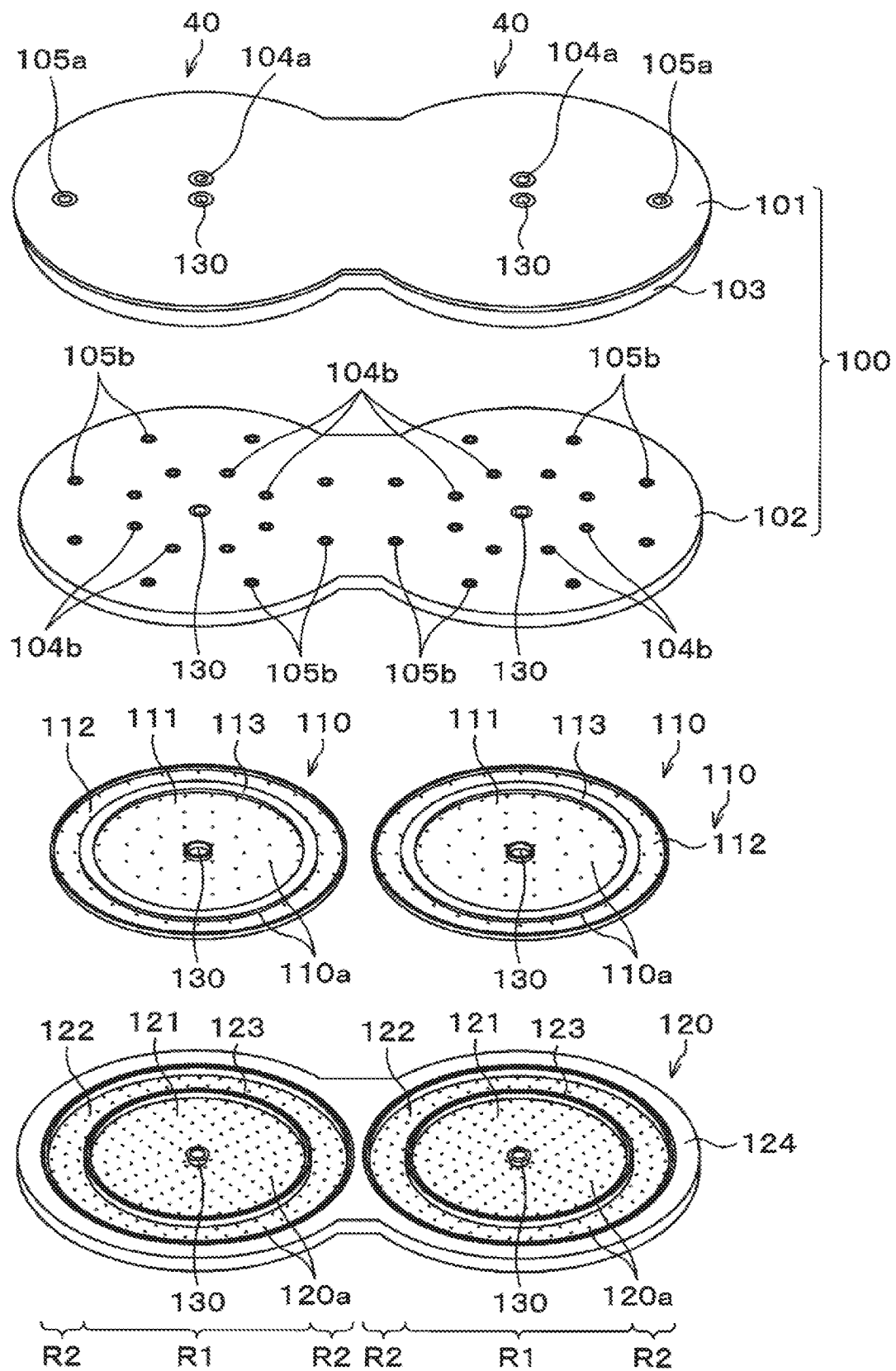
FIG. 4 is a diagram schematically illustrating a configuration of a shower head.

As illustrated in FIG. 4, the shower head 40 has a configuration in which an upper ceiling plate 101 and a lower ceiling plate 102, which constitute the ceiling plate 100 together, a diffusion plate 110, and a shower plate 120 are stacked from the upper side in this order. As illustrated in FIG. 3, a diffusion space D is formed in a space surrounded by the ceiling plate 100 and the shower plate 120. The diffusion plate 110 is provided in the diffusion space D. Further, the upper ceiling plate 101, the lower ceiling plate 102, the diffusion plate 110, and the shower plate 120, for example, are formed of aluminum.

As illustrated in FIGS. 3 and 4, the shower head 40 is divided into a central region R1 that faces a central portion of the stage 11, and an outer peripheral region R2 having the same central axis as the central region R1 and configured to surround the central region R1. The shower head 40 is configured to supply the treatment gas to each of the central region R1 and the outer peripheral region R2.

The shower head 40 is divided into the central region R1 and the outer peripheral region R2 in this way, the diffusion space D, the diffusion plate 110, and the shower plate 120 are also divided correspondingly. That is, the diffusion space D is divided into a central diffusion space D1 corresponding to the central region R1 and an outer peripheral diffusion space D2 corresponding to the outer peripheral region R2. The diffusion plate 110 has a central diffusion plate 111 provided in the central diffusion space D1, and an outer peripheral diffusion plate 112 provided in the outer peripheral diffusion space D2. The shower plate 120 has a central shower plate 121 provided to correspond to the central diffusion space D1 (the central region R1), and an outer peripheral shower plate 122 provided to correspond to the outer peripheral diffusion space D2 (the outer peripheral region R2). In other words, the central diffusion space D1, the central diffusion plate 111, and the central shower plate 121 constitute the central region R1. Further, the outer peripheral diffusion space D2, the outer peripheral diffusion plate 112, and the outer peripheral shower plate 122 constitute the outer peripheral region R2.

Ceiling Plate

In the ceiling plate 100, the upper ceiling plate 101 and the lower ceiling plate 102 are provided in common in the two shower heads 40. A protrusion 103 that protrudes downwards is provided at an outer peripheral portion of the upper ceiling plate 101. The lower ceiling plate 102 is accommodated inside the protrusion 103.

The ceiling plate 100 has a central gas supply passage 104 that supplies the treatment gas to the central diffusion space D1, and an outer peripheral gas supply passage 105 that supplies the treatment gas to the outer peripheral diffusion space D2. The central gas supply passage 104 and the outer peripheral gas supply passage 105 are formed to correspond to the stages 11, respectively.

The central gas supply passage 104 passes through the upper ceiling plate 101 and the lower ceiling plate 102. The upper surface of the upper ceiling plate 101 has a central gas introduction hole 104a of the central gas supply passage 104, for example, at one place thereof (see FIG. 4). The lower surface of the lower ceiling plate 102 has central gas discharge holes 104b of the central gas supply passage 104, which are concentrically disposed at substantially the same interval in a circumferential direction, for example, at 8 places thereof. In the central gas supply passage 104, one central gas introduction hole 104a of the upper ceiling plate 101 is branched to 8 places (not illustrated) to reach the central gas discharge holes 104b.

The outer peripheral gas supply passage 105 passes through the upper ceiling plate 101 and the lower ceiling plate 102. The upper surface of the upper ceiling plate 101 has an outer peripheral gas introduction hole 105a of the outer peripheral gas supply passage 105, for example, at one place thereof (see FIG. 4). The lower surface of the lower ceiling plate 102 has outer peripheral gas discharge holes 105b of the outer peripheral gas supply passage 105 which are concentrically disposed at substantially the same interval in the circumferential direction, for example, at 8 places thereof. In the outer peripheral gas supply passage 105, one outer peripheral gas introduction hole 105a of the upper ceiling plate 101 is branched to 8 places (not illustrated) to reach the outer peripheral gas discharge holes 105b.

Further, FIG. 4 illustrates a perspective view of the shower head 40, when viewed from the top, but in order to facilitate the understanding of the technology, a central gas discharge hole 104b and an outer peripheral gas discharge hole 105b formed on the lower surface of the lower ceiling plate 102 are illustrated.

Further, the ceiling plate 21 is provided with a heater (not illustrated), and is heated, for example, to 100 degrees C. to 150 degrees C. Through the heating, the foreign substances included in the treatment gas are prevented from being attached to the shower head 40.

Diffusion Plate

The diffusion plates 110 are individually provided in the shower heads 40. Further, in the diffusion plate 110, a central diffusion plate 111 and an outer peripheral diffusion plate 112 are integrally provided. A ring-shaped protrusion 113 that protrudes upwards is provided at a border between the central diffusion plate 111 and the outer peripheral diffusion plate 112 in the diffusion plate 110. Because the protrusion 113 contacts the lower surface of the lower ceiling plate 102, the diffusion space D is divided into a central diffusion space D1 and an outer peripheral diffusion space D2. As a result, the treatment gas supplied from the central gas supply passage 104 to the central diffusion space D1, and the treatment gas supplied from the outer peripheral gas supply passage 105 to the outer peripheral diffusion space D2 can be prevented from being mixed.

The lower surface of the diffusion plate 110 has a plurality of gas diffusion holes 110a. The plurality of gas diffusion holes 110a are formed in the central diffusion plate 111 and the outer peripheral diffusion plate 112. Further, as the treatment gas supplied from the central gas supply passage 104 passes through the plurality of gas diffusion holes 110a, the diffusion of the treatment gas in the central diffusion space D1 is expedited. Further, as the treatment gas supplied from the outer peripheral gas supply passage 105 passes through the plurality of gas diffusion holes 110a, the diffusion of the treatment gas in the outer peripheral diffusion space D2 is expedited. As a result, the treatment gas can be uniformly supplied from the shower plate 120 to the entire surface of the wafer W placed on the stage 11.

Further, in the present embodiment, in both the central diffusion plate 111 and the outer peripheral diffusion plate 112, the inner diameter of the gas diffusion holes 110a is 0.5 mm to 2 mm. The opening ratio of the central diffusion plate 111 and the outer peripheral diffusion plate 112 are both 30% to 50%. The number of the holes of the central diffusion plate 111 is equal to or less than the number of the holes of the outer peripheral diffusion plate 112.

Shower Plate

In the shower plate 120, a pair of central shower plates 121 and an outer peripheral shower 122 are individually provided in the shower heads 40. A ring-shaped protrusion 123 that protrudes toward the upper side is provided at a border between the central shower plate 121 and the outer peripheral shower plate 122. Because the protrusion 123 contacts the lower surface of the diffusion plate 110, the diffusion space D is divided into a central diffusion space D1 and an outer peripheral diffusion space D2. As a result, the treatment gas supplied from the central diffusion plate 111 to the central diffusion space D1, and the treatment gas supplied from the outer peripheral diffusion plate 112 to the outer peripheral diffusion space D2 can be prevented from being mixed.

Further, in the shower plate 120, two pairs of central shower plates 121 and an outer peripheral shower plate 122 corresponding to the two shower heads 40 are integrally provided. A protrusion 124 that protrudes toward the upper side is provided at an outer peripheral portion of the shower plate 120. The diffusion space D is formed inside the shower head by bringing the protrusion 124 and the protrusion 103 into contact with each other.

A plurality of gas supply holes 120a are formed on a lower surface of the shower plate 120. The plurality of gas supply holes 120a are formed in the central shower plates 121 and the outer peripheral shower plate 122. Further, the treatment gas of the central diffusion space D1 is uniformly supplied into the treatment container 10 while passing through the plurality of gas supply holes 120a. Similarly, the treatment gas of the outer peripheral diffusion space D2 is uniformly supplied into the treatment container 10 while passing through the plurality of gas supply holes 120a. As a result, the treatment gas may be uniformly supplied, from the shower plate 120 to the entire surface of the wafer W placed on the stage 11.

Further, in the present embodiment, while the outer diameter of the wafer W is 300 mm, the outer diameter of the central shower plates 121 is 224 mm and the outer diameter of the outer peripheral shower plate 122 is 297 mm.

Pressure Measurement Passage

Figure 5:
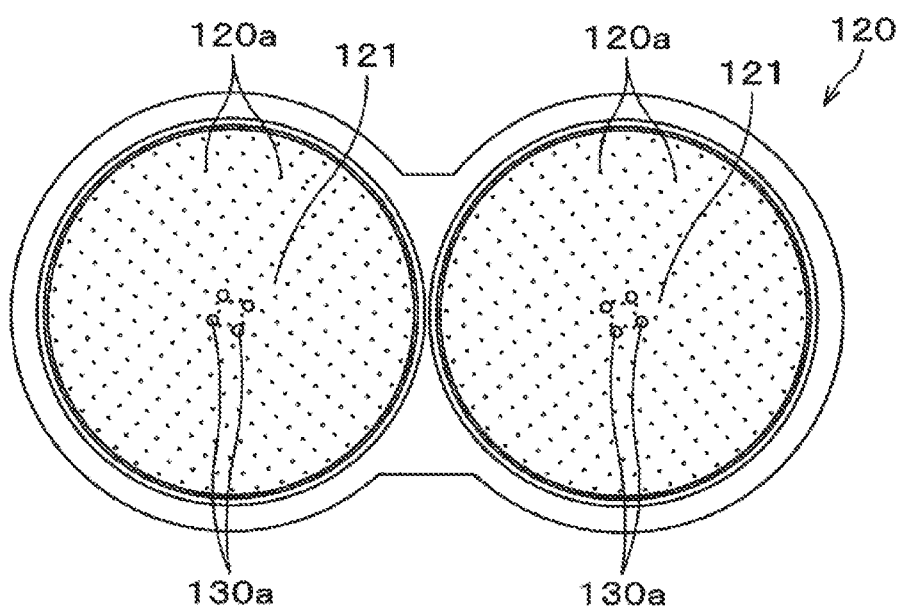
FIG. 5 is a plan view of the shower head (shower plate), when viewed from the bottom.

A pressure measurement passage 130 for measuring the pressure in the treatment container 10 is formed at the center of the shower head 40. The pressure measurement passage 130, for example, is a passage that passes through the centers of the upper ceiling plate 101 and the lower ceiling plate 102, the center of the central diffusion plate 111, and the center of the central diffusion space D1. The pressure measurement passage 130 is branched to four passages in the central shower plate 121, and is communicated with a plurality of, for example, four pressure measurement holes 130a formed on the lower surface of the shower plate 121 as illustrated in FIG. 5.

Here, if the treatment gas is supplied into the treatment container 10 during etching, the pressure measurement hole 130a opened toward the treatment container 10 may be a factor that disturbs the flows of the treatment gas. That is, for example, as the treatment gas is introduced into the pressure measurement hole 130a, the flows of the treatment gas that faces the wafer W placed on the stage 11 are disturbed. Further, for example, if the air is introduced from the pressure measurement hole 130a into the treatment container 10, the flows of the treatment gas are also disturbed.

In the present embodiment, since the pressure measurement hole 130a is formed at the central portion, the disturbance of the treatment gas can be controlled by concentrating the disturbance of the treatment gas on the central portion. Moreover, because four pressure measurement holes 130a are formed, the influence of the pressure measurement holes 130a on the treatment gas can be dispersed and thus the disturbance of the treatment gas can be further suppressed.

Gas Box

The gas box 41 has a $F_2$ gas flow rate controller 140 that supplies an $F_2$ gas, a $ClF_3$ gas flow rate controller 141 that supplies a $ClF_3$ gas, a HF gas flow rate controller 142 that supplies a HF gas, and an AR gas flow rate controller 143 that supplies an Ar gas. The gas flow rate controllers 140 to 143 are provided in the central gas supply passage 104 and the outer peripheral gas supply passage 105. Further, the gas flow rate controllers 140 to 143 include, e.g., mass flow controllers. Further, the gas flow rate controllers 140 to 143 are not limited to the mass flow controllers, but may include arbitrary controllers that control gas flows.

An $F_2$ gas supply pipe 144 is connected to the $F_2$ gas flow rate controller 140, a $ClF_3$ gas supply pipe 145 is connected to the $ClF_3$ gas flow rate controller 141, a HF gas supply pipe 146 is connected to the HF gas flow rate controller 142, and an AR gas supply pipe 147 is connected to the Ar gas flow rate controller 143. The gas supply pipes 144 to 147 are connected to a collective pipe 148. Two collective pipes 148 are connected to each of the central gas supply passage 104 and the outer peripheral gas supply passage 105. Further, the $F_2$ gas, the $ClF_3$ gas, the HF gas, and the Ar gas are supplied from the shower heads 40 to the treatment container 10 via the gas supply pipes 144 to 147 and the collective pipe 148.

Each of the $F_2$ gas supply pipe 144, the $ClF_3$ gas supply pipe 145, the HF gas supply pipe 146, the Ar gas supply pipe 147, and the collective pipe 148 is provided to an opening/closing valve 149 that opens and closes the gas supply pipes 144 to 147 and the collective pipe 148.

Further, the gas box 41 has a $NH_3$ gas flow rate controller 150 that supplies the $NH_3$ gas, and a $N_2$ gas flow rate controller 151 that supplies the $N_2$ gas. The gas flow rate controllers 150 and 151 are provided in each of the central gas supply passage 104 and the outer peripheral gas supply passage 105. Further, the gas flow rate controllers 150 and 151, for example, include mass flow controllers. Further, the gas flow rate controllers 150 and 151 are not limited to the mass flow controllers, but may include arbitrary controllers that control gas flows.

An $NH_3$ gas supply pipe 152 is connected to the $NH_3$ gas flow rate controller 150, and a $N_2$ gas supply pipe 153 is connected to the $N_2$ gas flow rate controller 151. The gas supply pipes 152 and 153 are connected to a collective pipe 154. Two collective pipes 154 are connected to each of the central gas supply passage 104 and the outer peripheral gas supply passage 105. Further, the $NH_3$ gas and the $N_2$ gas are supplied from the shower heads 40 to the treatment container 10 via the gas supply pipes 152 and 153 and the collective pipe 154.

Each of the $NH_3$ gas supply pipe 152, the $N_2$ gas supply pipe 153, and the collective pipe 154 is provided with an opening/closing valve 155 that opens and closes the gas supply pipes 152 and 153 and the collective pipe 154.

Among the treatment gases that are supplied from the gas supply 12, the $F_2$ gas (or the $ClF_3$ gas) is an etching gas used for etching the SiGe film, and the $F_2$ gas (or the $ClF_3$ gas) and the $NH_3$ gas are etching gases used for etching the Si film. The HF gas and the $NH_3$ gas are used for removing the natural oxide film and terminating the film after the etching, respectively. The Ar gas and the $N_2$ gas are used as dilution gases and purge gases, respectively.

Etching Process

Next, the etching process in the etching apparatus 1 configured as described above will be described. As described above, the etching apparatus 1 of the present embodiment etches a silicon germanium (SiGe) film as a silicon-containing film formed on the wafer W.

When the wafer is treated, the wafer W is transferred into the treatment container 10 by a transfer mechanism (not illustrated) provided outside the etching apparatus 1 in a state in which the partition wall 13 is lowered to an retreated position as illustrated in FIG. 2, and is placed on the stage 11.

Thereafter, as illustrated in FIG. 1, the partition wall 13 is lifted up to the wafer treatment position. Accordingly, the treatment space S is formed by the partition wall 13.

Further, the wafer W is etched by exhausting the interior of the treatment container 10 to a predetermined pressure by the gas exhaust mechanism 80 and supplying the treatment gas from the gas box 41 into the treatment container 10.

Figure 6:
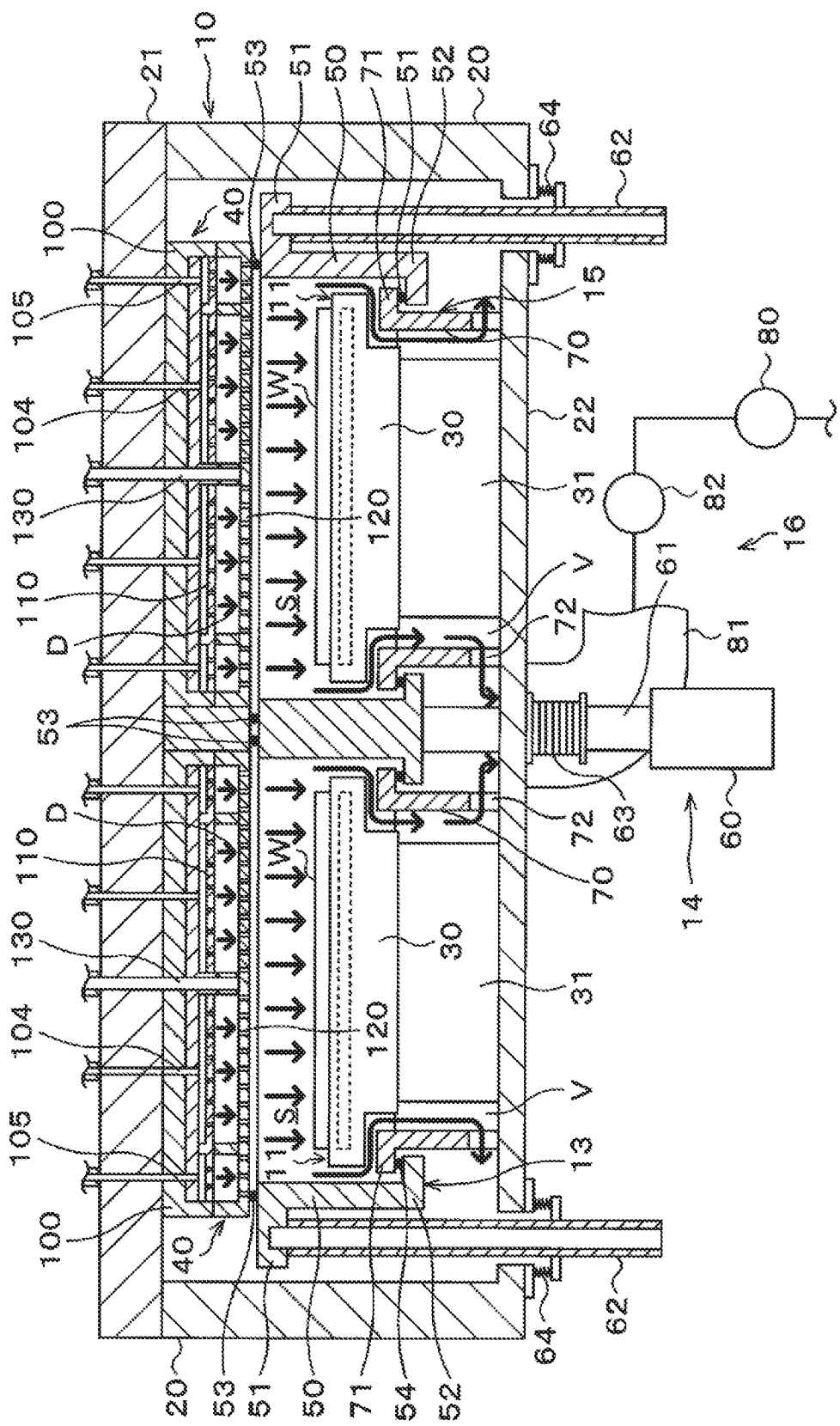
FIG. 6 is a diagram illustrating flows of a treatment gas in the etching apparatus.

In the etching process, the treatment gas that is a mixture gas of the $F_2$ gas and the Ar gas supplied from the gas box 41, is supplied into the treatment space S through the shower head 40, and is supplied to the wafer W as illustrated in FIG. 6. At this time, the treatment gas, the flow rate of which has been controlled, is supplied, from the shower heads 40, to each of the central shower plates 121 (the central region R1) and the outer peripheral shower plates 122 (the outer peripheral region R2). Accordingly, the treatment gas supplied from the shower head 40 is uniformly supplied to a surface of the wafer. Further, the SiGe film on the wafer W is etched by the treatment gas. Further, a method for controlling the flow rate of the treatment gas will be described later.

As illustrated in FIG. 6, the treatment gas in the treatment space S is discharged by the gas exhaust mechanism 80 from an outer periphery of the wafer W placed on the stage 11 via the exhaust space V and the slit 72 of the inner wall 15, and the gas exhaust pipe 81. Further, in FIG. 6, the arrow of a thick line indicates the flows of the treatment gas.

When the etching process is completed, the partition wall 13 is lowered to the retreated position, and the wafer W on the stage 11 is carried out by a wafer transfer mechanism (not illustrated) to the outside of the etching apparatus 1. Thereafter, the wafer W is heated by a heating device provided outside the etching apparatus 1, and the reaction product generated by the etching process is removed while being vaporized. Accordingly, a series of wafer treatments are ended.

According to the embodiment, the shower head 40 is divided into the central region R1 and the outer peripheral region R2, and the treatment gas having a controlled flow rate is supplied to each of the central shower plates 121 and the outer peripheral shower plates 122. Accordingly, the treatment gas from the shower heads 40 is uniformly supplied to the surface of the wafer W placed on the stage 11. As a result, the etching amount on the wafer W can be made uniform, so that the etching can be performed with a good in-plane uniformity.

Further, the inner diffusion space D of the shower head 40 is divided into a central diffusion space D1 and an outer peripheral diffusion space D2, and the treatment gas can be diffused in each of the central diffusion space D1 and the outer peripheral diffusion space D2, by the central diffusion plate 111 and the outer peripheral diffusion plate 112, respectively. Accordingly, the treatment gas can be uniformly supplied in each of the central shower plate 121 and the outer peripheral shower plate 122.

Figure 7:
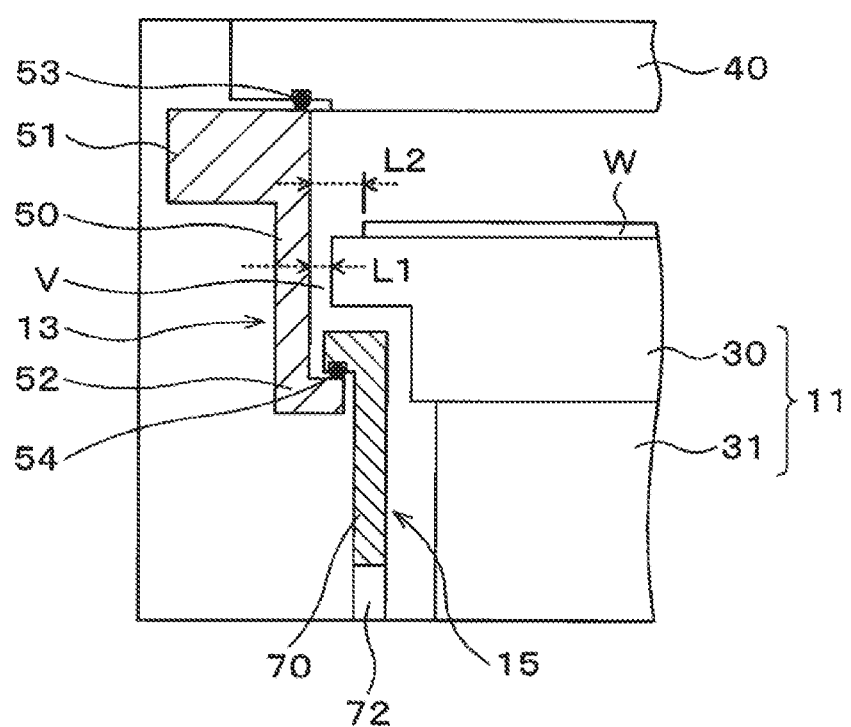
FIG. 7 is a diagram illustrating the relationship between a partition wall and a stage.

Here, as illustrated in FIG. 7, the distance L1 between the inner surface of the cylindrical part 50 of the partition wall 13 and the outer surface of the upper member 30 of the stage 11 is about 6.5 mm. Further, the distance L2 between the inner surface of the cylindrical part 50 and an outer peripheral portion of the wafer W is about 10 mm. The exhaust space V between the partition wall 13 and the upper member 30 is very small. In this case, because the flow speed of the treatment gas that flows from the treatment space S to the exhaust space V becomes higher between the partition wall 13 and the upper member 30, the treatment gas does not sufficiently stay at an outer peripheral portion of the wafer W and thus the etching amount (etching rate) easily becomes smaller.

In the present embodiment, by controlling the flow rate of the treatment gas in the central region R1 and the outer peripheral region R2 of the shower head 40, it is possible to uniformly supply the treatment gas to the surface of the wafer W. As a result, the etching amount on the surface of the wafer W can be made uniform by improving the etching amount at an outer peripheral portion of the wafer W. In particular, as described above, because the etching amount at the outer peripheral portion of the wafer W tends to become smaller, it is preferable that the amount of the treatment gas supplied becomes larger at the central portion than that at the outer peripheral surface of the wafer W.

Etching Control

Next, a method for adjusting (controlling) the flow rate of the treatment gas supplied from each of the central region R1 and the outer peripheral region R2 of the shower head 40 when the etching apparatus 1 etches the SiGe film will be described.

The inventors found out, after reviewing the example, that the flow rate of the treatment gas and the etching amount (etching rate) have the following correlation. That is, because the time for which the treatment gas stays in contact with the wafer W becomes shorter if the flow speed of the treatment gas becomes higher, the etching amount becomes smaller. Meanwhile, because the stay time of the treatment gas for the wafer W becomes longer if the flow speed of the treatment gas becomes lower, the etching amount becomes larger. In the present embodiment, the flow rate of the treatment gas is controlled on the basis of this experience.

Figure 8:
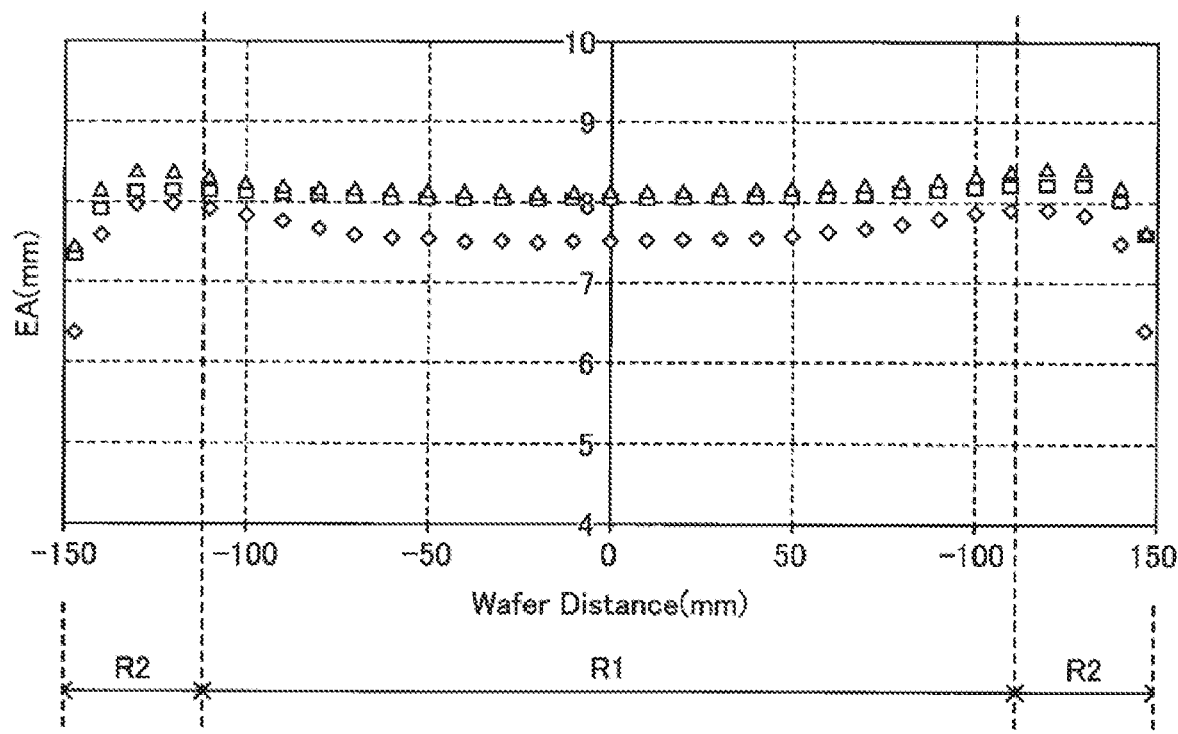
FIG. 8 is a diagram illustrating a result obtained by etching a SiGe film by controlling the flow rate of the treatment gas.
Figure 9:
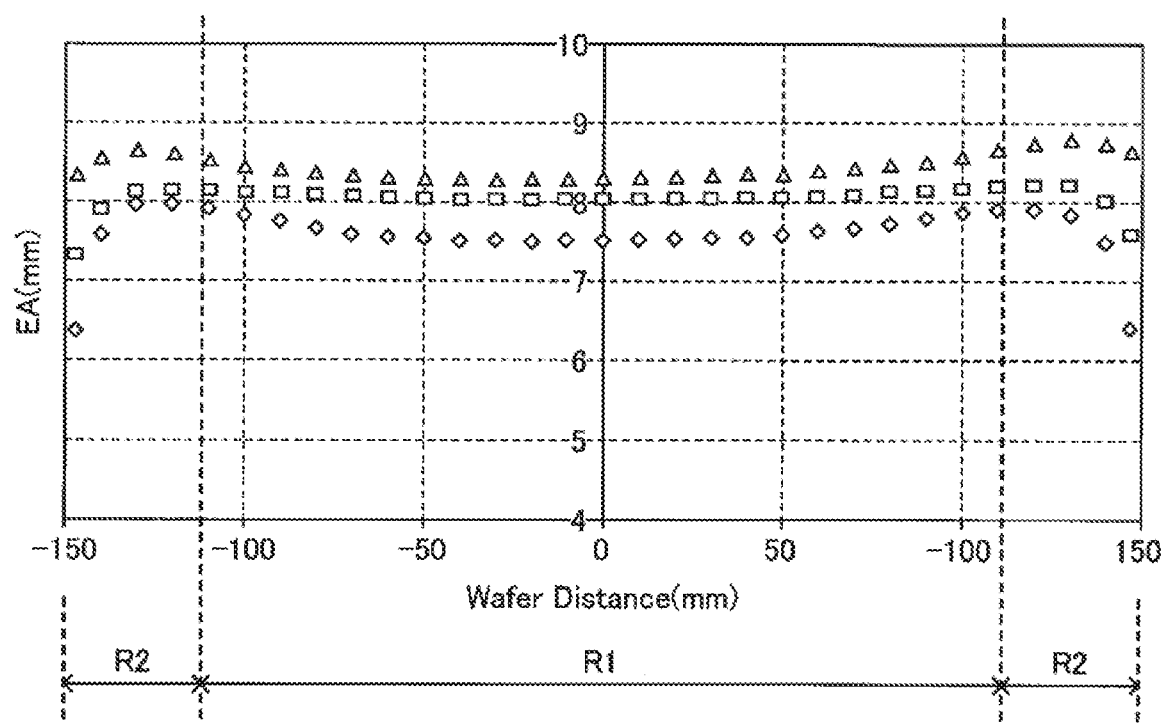
FIG. 9 is a diagram illustrating a result obtained by etching a SiGe film by controlling the flow rate of the treatment gas.
Figure 10:
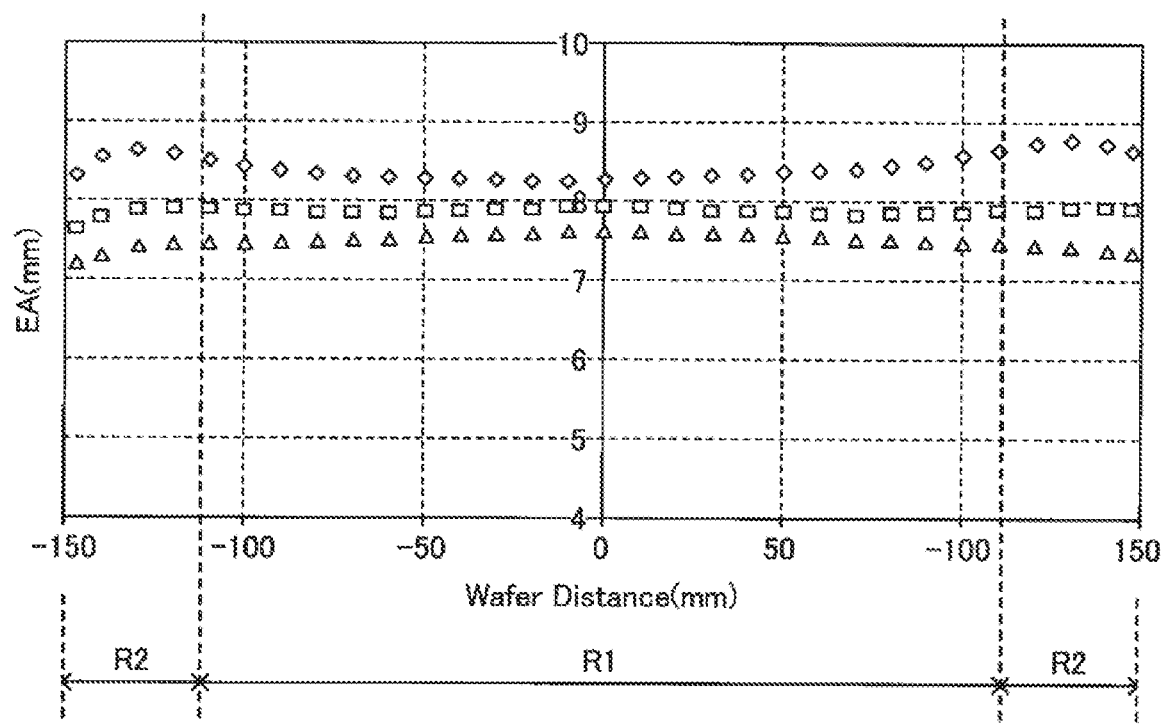
FIG. 10 is a diagram illustrating a result obtained by etching a SiGe film by controlling the flow rate of the treatment gas.

FIGS. 8 to 10 illustrate results obtained by etching a SiGe film using the treatment gas while controlling the flow rate of the treatment gas, and illustrate the distributions of the etching amount on the surface of the wafer. In the graphs of FIGS. 8 to 10, the transverse axis denotes a horizontal distance (the center is zero) from the center of the wafer and the longitudinal axis denotes the etching amount (EA).

As the treatment gas, a $F_2$ gas was used as an etching gas and an Ar gas was used as a dilution gas. In the tables of FIGS. 8 to 10, the flow rate of the $F_2$ gas and the flow rate of the Ar gas in each of the central region R1 and the outer peripheral region R2 are illustrated. Further, in the tables of FIGS. 8 to 10, "±%" and "3σ%" both denote the in-plane uniformity on the surface of the wafer, "±%" was calculated from (Max EA−Min EA)/2/(Ave. EA) and "3σ%" was calculated from (3σ EA)/(Ave. EA).

First, as indicated by "◇" in FIG. 8, the flow rate of the $F_2$ gas in the central region R1 and the outer peripheral region R2 were 40 sccm, and the flow rate of the Ar gas in each of the central region R1 and the outer peripheral region R2 were 200 sccm. That is, the flow rates of the $F_2$ gas and the Ar gas in the central region R1 and the outer peripheral region R2 are the same. This example represents a conventional example having one region in which the shower head is not divided into two regions. In this case, the etching amount at the central portion of the wafer W is small and the etching amount at the outer peripheral portion of the wafer W is also small.

Accordingly, first, in order to make the etching amount at the central portion of the wafer W large, the flow speed of the gas at the central portion of the wafer W is made slower. In detail, as indicated by "∇" and "Δ" in FIG. 8, the flow rate of the Ar gas in the central region R1 is decreased from 200 sccm to 100 sccm and 75 sccm, respectively. By doing so, the etching amount at the central portion of the wafer W is increased, and the in-plane uniformity of the surface is enhanced.

Accordingly, first, in order to make the etching amount at the outer peripheral portion of the wafer W large, the flow speed of the gas at the outer peripheral portion of the wafer W is made slower. In detail, as indicated by "Δ" of FIG. 9, the flow rate of the Ar gas in the outer peripheral region R2 was decreased from 200 sccm to 100 sccm. By doing so, the etching amount at the outer peripheral portion of the wafer W was increased, and the in-plane uniformity on the surface was enhanced. Further, "◇" and "∇" of FIG. 9 are the same as "◇" and "∇" of FIG. 8.

In this way, because the flow speed of the treatment gas could be optimized by decreasing the flow rates of the Ar gas in the central region R1 and the outer peripheral region R2, the in-plane uniformity of the etching amount on the surface of the wafer could be enhanced.

Meanwhile, referring "Δ" of FIG. 9, the etching amount at the outer peripheral portion of the wafer W is somewhat large. In order to adjust this, the flow rate of the $F_2$ gas is controlled next. In detail, as indicated by "∇" and "Δ" of FIG. 10, the flow rate of the $F_2$ gas in the outer region R2 was decreased from 40 sccm to 35 sccm and 30 sccm, respectively. Accordingly, the etching amount at the outer peripheral portion of the wafer W decreased, and the in-plane uniformity on the surface was enhanced. In detail, as compared with ±10.6% and 3σ14% of "◇" of FIG. 8, ±1.8% and 3σ2.0% were possible in "∇" of FIG. 10. Further, "◇" of FIG. 10 is the same as "Δ" of FIG. 9.

As described above, when the flow rate of the treatment gas is controlled, the flow rates of the Ar gas which can adjust the flow speed of the treatment gas more easily is firstly controlled in the central region R1 and the outer peripheral region R2. Further, after the flow rate of the treatment gas is optimized, the flow rate of the $F_2$ gas is controlled in the outer peripheral region R2. In this way, by individually controlling the flow rates of the Ar gas and the $F_2$ gas in the central region R1 and the outer peripheral region R2, the uniformity of the etching amount on the surface of the wafer can be enhanced.

Further, in the embodiment, although the flow rate of the $F_2$ gas was controlled after the flow rate of the Ar gas was controlled, the sequence can be reversed. That is, after the flow rate of the $F_2$ gas is controlled, the flow rate of the Ar gas may be controlled.

Further, the above-described control of the flow rates of the Ar gas and the $F_2$ gas is only an example, and the control of the flow rates of the Ar gas and $F_2$ gas is actually changed according to the state of the wafer W. Considering the tendency of the etching amount (etching rate) on the surface of the wafer, the in-plane uniformity of the etching amount on the surface can be secured by individually adjusting the flow rate of the Ar gas and the flow rate of the $F_2$ gas in the central region R1 and the outer peripheral region R2.

Further, although the control of the flow rate of the treatment gas when the SiGe film is etched by the etching apparatus 1 has been described in the above embodiment, the control of the etching of the present embodiment may be applied to the case when another silicon-containing film is etched.

For example, when the Si film is etched, the mixture gas of the $F_2$ gas and the $NH_3$ gas is used as the etching gas of the treatment gas and the Ar gas is used as the dilution gas. Further, the gas mixed with the $F_2$ gas is not limited to the $NH_3$ gas, and may be a basic gas.

Further, similarly to the embodiment described above, after the flow rates of the Ar gas is controlled in the central region R1 and the outer peripheral region R2, the flow rates of the etching gas including the $F_2$ gas and the $NH_3$ gas are controlled in the central region R1 and the outer peripheral region R2. Accordingly, the uniformity of the etching amount of the Si film on the surface of the wafer can be enhanced.

Further, the control of the etching of the present embodiment may also be applied to a case in which a germanium film (Ge film) is etched. When the Ge film is etched, the same gas as the etching gas for the SiGe film, for example, a $F_2$ gas is used as the etching gas of the treatment gas. Further, similarly to the embodiment described above, after the flow rate of the Ar gas is controlled in the central region R1 and the outer peripheral region R2, the flow rate of the etching gas including the $F_2$ gas is controlled in the central region R1 and the outer peripheral region R2. Accordingly, the uniformity of the etching amount of the Ge film on the surface of the wafer can be enhanced.

Other Embodiments

Next, a configuration of the shower head 40 according to another embodiment will be described. Although the position in the radial direction of the central gas introduction hole 104a and the position in the radial direction of the central gas discharge hole 104b coincide with each other in the ceiling plate 100 of the shower head 40 in the embodiment described above, the central gas discharge hole 104b may be disposed radially inward than the central gas introduction hole 104a, as illustrated in FIG. 11.

Figure 11:
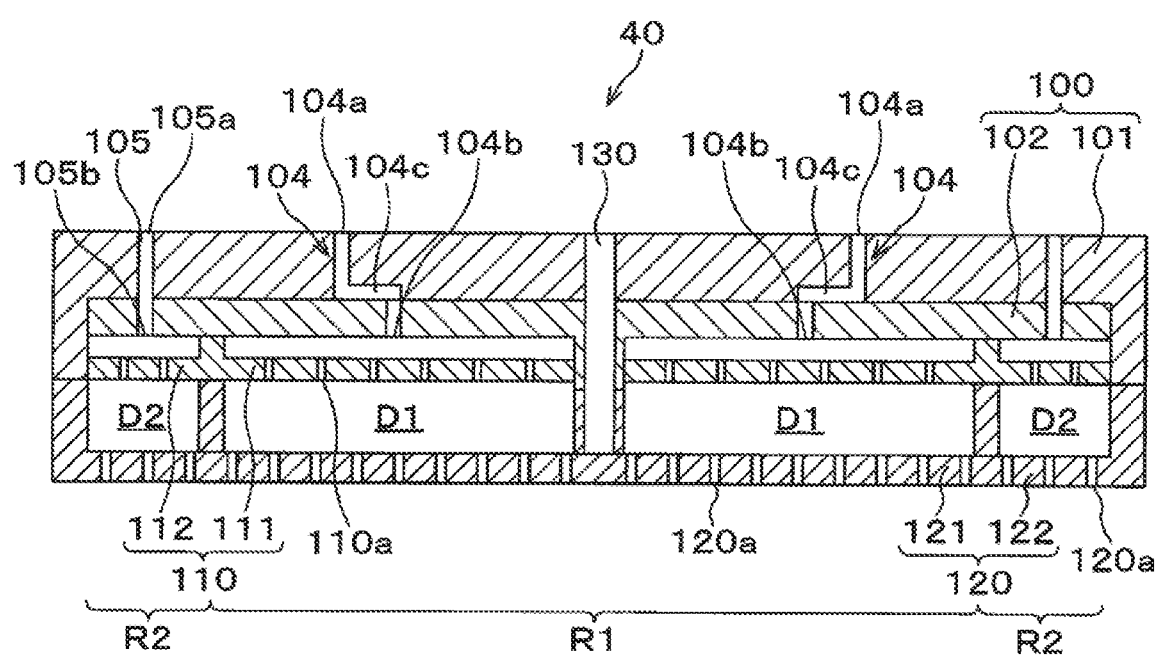
FIG. 11 is a longitudinal sectional view schematically illustrating a configuration of a shower head according to another embodiment.
Figure 12:
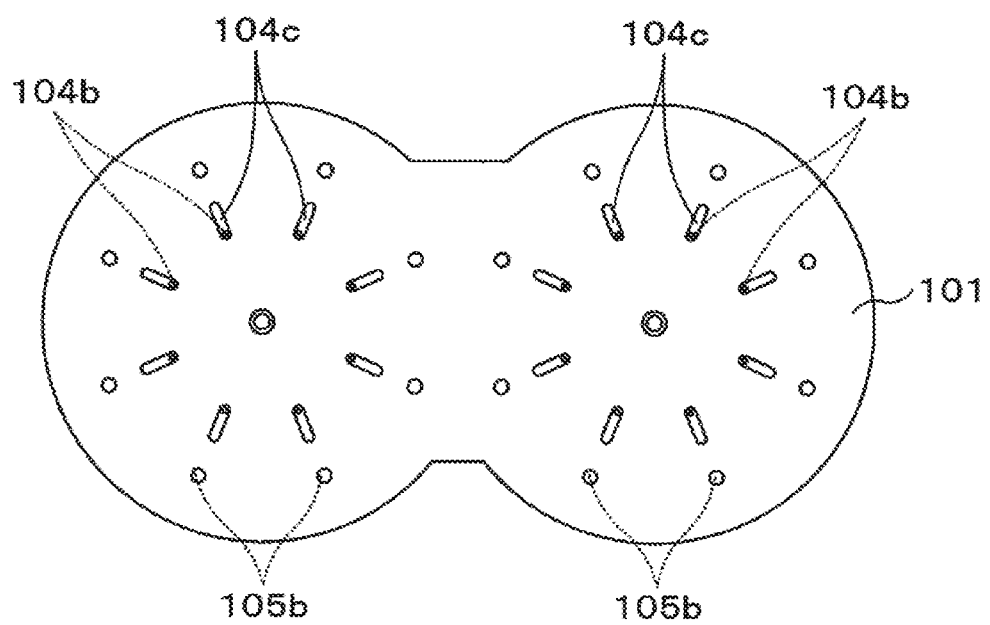
FIG. 12 is a plan view of an upper ceiling plate according to another embodiment, when viewed from the bottom.

In this case, for example, as illustrated in FIGS. 11 and 12, on the lower surface of the upper ceiling plate 101, the central gas supply passage 104 has a central gas supply extension passage 104c that extends radially. That is, the upper ceiling plate 101 functions as a position-adjusting plate that adjusts the supply position of the treatment gas to the central diffusion space D1 in the radial direction. Further, FIG. 12 illustrates a plan view of the upper ceiling plate 101, when viewed from the bottom, but in order to facilitate the understanding of the technology, central gas discharge holes 104b and outer peripheral gas discharge holes 105b formed on the lower surface of the lower ceiling plate 102 are indicated.

Figure 13:
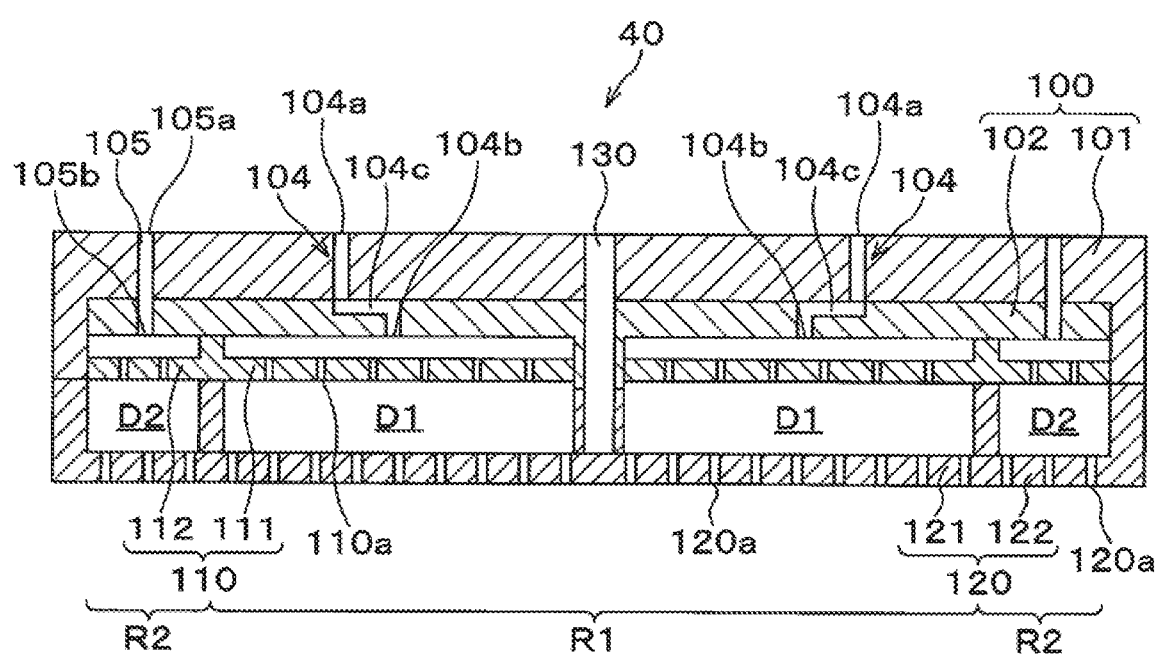
FIG. 13 is a longitudinal sectional view schematically illustrating a configuration of a shower head according to another embodiment.

Further, as illustrated in FIG. 13, the gas supply extension passage 104c may be formed on the upper surface of the lower ceiling plate 102. In this case, the lower ceiling plate 102 functions as a position-adjusting plate.

According to the present embodiment, the supply position of the treatment gas for the central diffusion space D1 can be adjusted by disposing the central gas discharge holes 104b on a radially inward position than the central gas introduction holes 104a. As a result, in the central diffusion space D1, the treatment gas can be diffused more suitably.

In other words, by allowing the upper ceiling plate 101 or the lower ceiling plate 102 to function as a position-adjusting plate, the position of the central gas discharge hole 104b can be freely adjusted, even if the position of the central gas introduction hole 104a is fixed. Accordingly, the degree of freedom in design is enhanced and the general-purpose use is possible.

Figure 14:
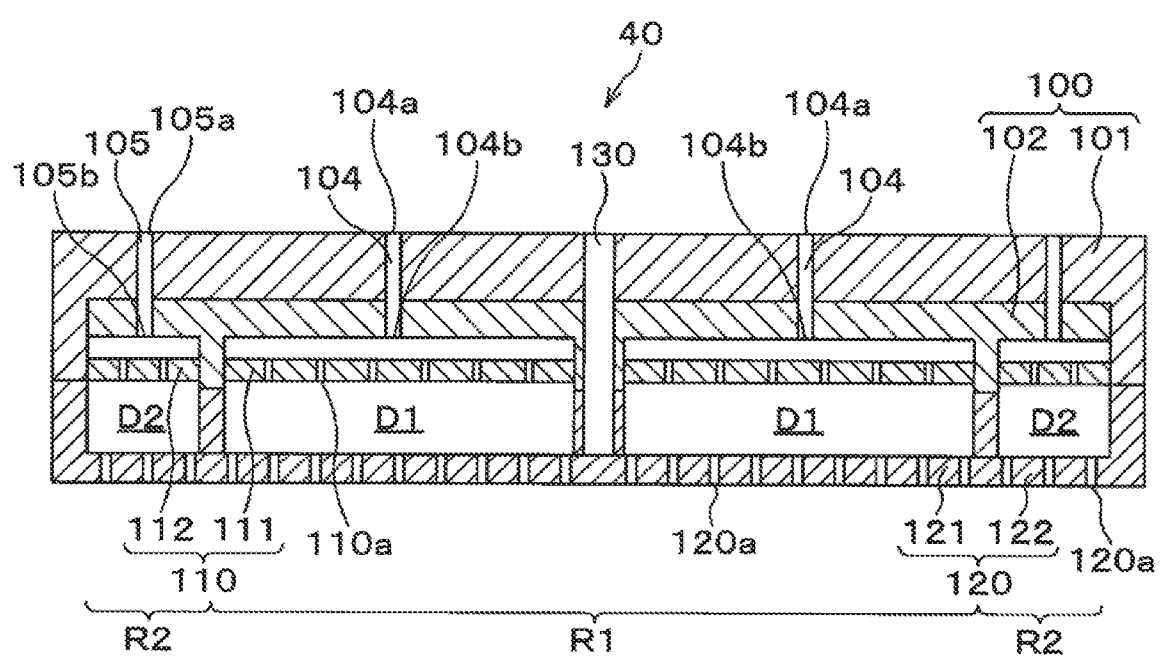
FIG. 14 is a longitudinal sectional view schematically illustrating a configuration of a shower head according to another embodiment.

Although the central diffusion plate 111 and the outer peripheral diffusion plate 112 are integrally formed in the above embodiments, the central diffusion plate 111 and the outer peripheral diffusion plate 112 may be provided as separate bodies as illustrated in FIG. 14.

Further, although the diffusion plate 110 is used as means for diffusing the treatment gas in the diffusion space D in the above embodiments, the present disclosure is not limited thereto. For example, as illustrated in FIG. 15, a diffusion member 200 may be provided instead of the diffusion plate 110. A central diffusion member 201 of the diffusion member 200 is provided in the central diffusion space D1, and is installed in the central gas discharge hole 104b. An outer peripheral diffusion member 202 is provided in the outer peripheral diffusion space D2, and is installed in the outer peripheral gas discharge hole 105b. A plurality of gas diffusing holes 200a are formed on the outer lateral surface of the central diffusion member 201 and the outer peripheral diffusion member 202 in the circumferential direction at substantially the same interval, respectively.

In the present embodiment, the treatment gas can be supplied horizontally from the central diffusion member 201 and the outer peripheral diffusion member 202, and can be diffused in the central diffusion space D1 and the outer peripheral diffusion space D2. However, after the investigation by the inventors, it is confirmed that the diffusion plate 110 has a higher diffusion effect of the treatment gas than the diffusion member 200.

Further, although only two stages 11 are provided as the plurality of stages in the above embodiments, the number of the installed stages is not limited to the present embodiment. Herein, the phrase "plurality of stages" means a plurality of placing surfaces, and, for example, it is understood that a configuration in which a plurality of wafers W are to be placed on one stage also fall within the scope of the plurality of stages.

Further, although one partition wall 13 is provided for the plurality of stages 11 in the above embodiments, the configuration of the partition wall 13 is not limited to the present embodiments. As long as an independent treatment space S can be defined for each of the stages 11, any partition wall having an arbitrary shape is possible. For example, a partition wall having only one cylindrical part 50 may be individually provided to each of the stages 11.

The disclosed embodiments should be considered as illustrative-purpose only in all aspects and should not be considered restrictive. Omissions, replacements, and modifications may be made in various forms without departing from the scope and purpose of the attached claims.

Further, the following configurations also fall within the technical scope of the present disclosure.

(1) A substrate etching apparatus for etching a substrate, the substrate etching apparatus including a treatment container configured to accommodate a substrate; a stage on which the substrate is placed disposed in the treatment container; a gas supply configured to supply a treatment gas from an upper space above the stage toward the stage; and a gas exhauster configured to exhaust an interior of the treatment container, wherein the gas supply includes: a central region facing a central part of the stage; and an outer peripheral region having a same central axis as the central region and configured to surround the central region, and wherein the gas supply is capable of supplying the treatment gas to each of the central region and the outer peripheral region.

According to (1), because the gas supply has a central region and an outer peripheral region and the treatment gas having a controlled flow rate is supplied to the central region and the outer peripheral region, the treatment gas is uniformly supplied to the surface of the substrate. As a result, because the etching amount of the substrate can be made uniform, whereby the surface can be uniformly etched.

(2) The substrate etching apparatus described in (1), wherein the gas supply includes: a ceiling plate provided at an upper portion of the treatment container; a shower plate disposed below the ceiling plate and having a plurality of gas supply holes through which the treatment gas is supplied into the interior of the treatment container; a diffusion space surrounded by the ceiling plate and the shower plate; and a diffusion plate provided in the diffusion space and having a plurality of gas diffusion holes through which the treatment gas is diffused, wherein the diffusion space includes: a central diffusion space corresponding to the central region; and an outer peripheral diffusion space corresponding to the outer peripheral region, wherein the shower plate includes: a central shower plate provided to correspond to the central diffusion space; and an outer peripheral shower plate provided to correspond to the outer peripheral diffusion space, wherein the plurality of gas supply holes are formed in each of the central shower plate and the outer peripheral shower plate, wherein the diffusion plate includes: a central diffusion plate provided in the central diffusion space; and an outer peripheral diffusion plate provided in the outer peripheral diffusion space, wherein the plurality of gas diffusion holes are formed in each of the central diffusion plate and the outer peripheral diffusion plate.

According to (2), the diffusion space has a central diffusion space and an outer peripheral diffusion space, and the treatment gas can be diffused by the central diffusion plate and the outer peripheral diffusion plate in the central diffusion space and the outer peripheral diffusion space, respectively. Accordingly, the treatment gas can be uniformly supplied to each of the central shower plate and the outer peripheral shower plate.

(3) The substrate etching apparatus described in (2), wherein the ceiling plate includes: a central gas supply passage through which the treatment gas is supplied to the central diffusion space; and an outer peripheral gas supply passage, through which the treatment gas is supplied to the outer peripheral diffusion space, wherein a central gas introduction hole of the central gas supply passage is formed on an upper surface of the ceiling plate, wherein a central gas discharge hole of the central gas supply passage is formed on a lower surface of the ceiling plate, and wherein the central gas discharge hole is disposed on a radially inward position than the central gas introduction hole.

(4) The substrate etching apparatus described in (3), wherein the ceiling plate is constituted by stacking an upper ceiling plate and a lower ceiling plate, wherein the central gas introduction hole is formed on an upper surface of the upper ceiling plate, wherein the central gas discharge hole is formed on a lower surface of the lower ceiling plate, and wherein a central gas supply extension passage extending radially is formed in the upper ceiling plate or the lower ceiling plate.

According to (3) and (4), the supply position of the treatment gas for the central diffusion space D1 can be controlled by disposing the central gas discharge hole on a radially inward position that the central gas introduction hole. As a result, in the central diffusion space, the treatment gas can be diffused more suitably.

Further, because the upper ceiling plate or the lower ceiling plate functions as a position-adjusting plate, the position of the central gas discharge hole can be freely adjusted, even if the position of the central gas introduction hole is fixed. Accordingly, the degree of freedom of design is enhanced, and the general-purpose use is possible.

(5) The substrate etching apparatus described in any one of (2) to (4), wherein a pressure measurement passage for measuring a pressure in the treatment container is formed at the center of the gas supply, and a plurality of pressure measurement holes in communication with the pressure measurement passage is formed at a central portion of a lower surface of the central shower plate.

According to (5), because the pressure measurement hole is formed at the central portion, the disturbance of the treatment gas can be controlled by concentrating the disturbance of the treatment gas on the central portion. Moreover, because the plurality of pressure measurement holes are formed, the influence on the treatment gas of the pressure measurement holes can be distributed and the disturbance of the treatment gas can be further suppressed.

(6) The substrate etching apparatus described in any one of (1) to (5), further including: a partition wall provided in the treatment container to surround the stage with a gap interposed between the partition wall and an outer periphery of the stage, wherein a treatment space formed inside the partition wall and in the upper space above the stage and the gas exhauster provided in a lower space below the stage are communicated with each other through a space between the partition wall and the stage.

According to (6), in the gas exhauster, the treatment gas in the treatment space is discharged through a space between the partition wall and the stage. Here, for example, because the distance between the partition wall and the stage is small, the flow rate of the treatment gas becomes higher between the partition wall and the stage, and thus the etching amount at the outer peripheral portion of the substrate tends to be smaller. Accordingly, an effect of enhancing the in-plane uniformity of the etching amount by controlling the flow rates of the treatment gas in each of the central region and the outer peripheral region as in (1), is particularly obtained by the configuration of this apparatus.

(7) The substrate etching apparatus described in any one of (1) to (6), further including: a controller configured to control a flow rate of the treatment gas supplied from the gas supply, wherein the treatment gas includes a fluorine containing gas and an inert gas, and wherein the controller executes a step of controlling a flow rate of the inert gas in each of the central region and the outer peripheral region, and a step of controlling a flow rate of the fluorine containing gas in each of the central region and the outer peripheral region.

According to (7), the flow rate of the treatment gas can be optimized by controlling the flow rates of the Ar gas in each of the central region and the outer peripheral region. Further, the in-plane uniformity of the etching amount on the surface of the substrate can be further enhanced by controlling the flow rates of the $F_2$ gas in each of the central region and the outer peripheral region.

(8) The substrate etching apparatus of any one of (1) to (7), wherein a silicon germanium film, a silicon film, or a germanium film on the substrate is etched.

(9) substrate etching method for etching a substrate using a substrate etching apparatus, the substrate etching apparatus includes: a treatment container configured to accommodate a substrate; a stage on which the substrate is placed in the treatment container; and a gas supply configured to supply a treatment gas from an upper space above the stage toward the stage, wherein the gas supply includes: a central region facing a central part of the stage; and an outer peripheral region having a same central axis as the central region and configured to surround the central region, and wherein the substrate etching method includes: supplying the treatment gas to the substrate placed on the stage in each of the central region and the outer peripheral region.

(10) The substrate etching method described in (9), wherein the treatment gas includes a fluorine containing gas and an inert gas, wherein the substrate etching method further includes a step of controlling a flow rate of the inert gas in each of the central region and the outer peripheral region, and a step of controlling a flow rate of the fluorine containing gas in each of the central region and the outer peripheral region, in order to control a flow rate of the treatment gas supplied to the substrate.

(11) The substrate etching method described in (10), wherein the flow rates of the inert gas and the fluorine containing gas are controlled based on etching rates of a central part and an outer peripheral part of the substrate, respectively.

(12) The substrate etching method of any one of (9) to (11), wherein a silicon germanium film, a silicon film, or a germanium film on the substrate is etched.

According to the present disclosure, the substrate can be uniformly etched using the treatment gas on the surface of the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate etching apparatus for etching a substrate, the substrate etching apparatus comprising:
    a treatment container configured to accommodate a substrate;
    a stage on which the substrate is placed, the stage being disposed in the treatment container;
    a gas supply configured to supply a treatment gas from an upper space above the stage toward the stage;

a gas exhauster configured to evacuate an interior of the treatment container;
a ceiling plate provided at an upper portion of the treatment container;
a shower plate disposed below the ceiling plate and having a plurality of gas supply holes through which the treatment gas is supplied into the interior of the treatment container;
a diffusion space surrounded by the ceiling plate and the shower plate; and
a diffusion plate provided in the diffusion space and having a plurality of gas diffusion holes through which the treatment gas is diffused,
wherein the gas supply comprises:
a central region facing a central part of the stage; and
an outer peripheral region having a same central axis as the central region and configured to surround the central region,
wherein the diffusion space comprises:
a central diffusion space corresponding to the central region; and
an outer peripheral diffusion space corresponding to the outer peripheral region,
wherein the shower plate comprises:
a central shower plate provided to correspond to the central diffusion space;
an outer peripheral shower plate provided to correspond to the outer peripheral diffusion space; and
a first ring-shaped protrusion protruding upwards, installed at a border between the central shower plate and the outer peripheral shower plate, and configured to contact a lower surface of the diffusion plate to divide the diffusion space into the central diffusion space and the outer peripheral diffusion space,
wherein the plurality of gas supply holes are formed in each of the central shower plate and the outer peripheral shower plate,
wherein the diffusion plate comprises:
a central diffusion plate provided in the central diffusion space;
an outer peripheral diffusion plate provided in the outer peripheral diffusion space; and
a second ring-shaped protrusion protruding upwards, installed at a border between the central diffusion plate and the outer peripheral diffusion plate, and configured to contact a lower surface of the ceiling plate to divide the diffusion space into the central diffusion space and the outer peripheral diffusion space,
wherein the plurality of gas diffusion holes are formed in each of the central diffusion plate and the outer peripheral diffusion plate, and
wherein the gas supply is capable of supplying the treatment gas to each of the central region and the outer peripheral region.

2. The substrate etching apparatus of claim 1, wherein a pressure measurement passage for measuring a pressure in the treatment container is formed at a center of the gas supply, and a plurality of pressure measurement holes in communication with the pressure measurement passage is formed at a central portion of a lower surface of the central shower plate.

3. The substrate etching apparatus claim 1, further comprising:
a partition wall provided in the treatment container to surround the stage with a gap interposed between the partition wall and an outer periphery of the stage,
wherein a treatment space formed inside the partition wall and in the upper space above the stage and the gas exhauster provided in a lower space below the stage are communicated with each other through a space between the partition wall and the stage.

4. The substrate etching apparatus of claim 1, further comprising:
a controller configured to control a flow rate of the treatment gas supplied from the gas supply,
wherein the treatment gas includes a fluorine containing gas and an inert gas, and
wherein the controller executes a step of controlling a flow rate of the inert gas in each of the central region and the outer peripheral region, and a step of controlling a flow rate of the fluorine containing gas in each of the central region and the outer peripheral region.

5. The substrate etching apparatus of claim 1, wherein a silicon germanium film, a silicon film, or a germanium film on the substrate is etched.

6. A substrate etching method for etching a substrate using the substrate etching apparatus of claim 1,
the substrate etching method comprising:
supplying the treatment gas to the substrate placed on the stage in each of the central region and the outer peripheral region.

7. The substrate etching method of claim 6, wherein a silicon germanium film, a silicon film, or a germanium film on the substrate is etched.

8. The substrate etching method of claim 6, wherein the treatment gas comprises a fluorine containing gas and an inert gas,
wherein the substrate etching method further comprises a step of controlling a flow rate of the inert gas in each of the central region and the outer peripheral region, and a step of controlling a flow rate of the fluorine containing gas in each of the central region and the outer peripheral region, in order to control a flow rate of the treatment gas supplied to the substrate.

9. The substrate etching method of claim 8, wherein the flow rates of the inert gas and the fluorine containing gas are controlled based on etching rates of a central part and an outer peripheral part of the substrate, respectively.

10. The substrate etching apparatus of claim 1, wherein the ceiling plate comprises:
a central gas supply passage through which the treatment gas is supplied to the central diffusion space; and
an outer peripheral gas supply passage, through which the treatment gas is supplied to the outer peripheral diffusion space,
wherein a central gas introduction hole of the central gas supply passage is formed on an upper surface of the ceiling plate,
wherein a central gas discharge hole of the central gas supply passage is formed on the lower surface of the ceiling plate, and
wherein the central gas discharge hole is disposed on a radially inward position than the central gas introduction hole.

11. The substrate etching apparatus of claim 10, wherein the ceiling plate is constituted by staking an upper ceiling plate and a lower ceiling plate,
wherein the central gas introduction hole is formed on an upper surface of the upper ceiling plate,
wherein the central gas discharge hole is formed on a lower surface of the lower ceiling plate, and wherein a central gas supply extension passage extending radially is formed in the upper ceiling plate or the lower ceiling plate.

12. The substrate etching apparatus of claim 11, wherein a pressure measurement passage for measuring a pressure in the treatment container is formed at a center of the gas supply, and a plurality of pressure measurement holes in communication with the pressure measurement passage is formed at a central portion of a lower surface of the central shower plate.

13. The substrate etching apparatus claim 12, further comprising:
   a partition wall provided in the treatment container to surround the stage with a gap interposed between the partition wall and an outer periphery of the stage,
   wherein a treatment space formed inside the partition wall and in the upper space above the stage and the gas exhauster provided in a lower space below the stage are communicated with each other through a space between the partition wall and the stage.

14. The substrate etching apparatus of claim 13, further comprising:
   a controller configured to control a flow rate of the treatment gas supplied from the gas supply,
   wherein the treatment gas includes a fluorine containing gas and an inert gas, and
   wherein the controller executes a step of controlling a flow rate of the inert gas in each of the central region and the outer peripheral region, and a step of controlling a flow rate of the fluorine containing gas in each of the central region and the outer peripheral region.

15. The substrate etching apparatus of claim 14, wherein a silicon germanium film, a silicon film, or a germanium film on the substrate is etched.

* * * * *